(12) United States Patent
Biber et al.

(10) Patent No.: US 8,952,694 B2
(45) Date of Patent: Feb. 10, 2015

(54) MAGNETIC RESONANCE COIL DEVICE

(75) Inventors: Stephan Biber, Erlangen (DE); Daniel Driemel, Oederan (DE)

(73) Assignee: Siemens Aktiengesellschaft, München (DE)

( * ) Notice: Subject to any disclaimer, the term of this patent is extended or adjusted under 35 U.S.C. 154(b) by 905 days.

(21) Appl. No.: 13/092,841

(22) Filed: Apr. 22, 2011

(65) Prior Publication Data

US 2011/0260728 A1 Oct. 27, 2011

(30) Foreign Application Priority Data

Apr. 23, 2010 (DE) .......................... 10 2010 028 163

(51) Int. Cl.
G01R 33/32 (2006.01)
G01R 33/34 (2006.01)
G01R 33/3415 (2006.01)

(52) U.S. Cl.
CPC .... G01R 33/34084 (2013.01); G01R 33/34061 (2013.01); *G01R 33/34007* (2013.01); *G01R 33/3415* (2013.01)
USPC .......................................................... 324/318

(58) Field of Classification Search
CPC ..................... G01R 33/3415; G01R 33/34084; G01R 33/34007; G01R 33/34061
USPC .......................................................... 324/318
See application file for complete search history.

(56) References Cited

U.S. PATENT DOCUMENTS

| 6,577,888 | B1 | 6/2003 | Chan et al. | |
| 6,980,002 | B1 | 12/2005 | Petropoulos et al. | |
| 7,333,849 | B1 * | 2/2008 | Su et al. ........................ | 600/422 |
| 7,526,330 | B1 * | 4/2009 | Randell et al. ................ | 600/421 |
| 8,046,046 | B2 * | 10/2011 | Chan et al. .................... | 600/422 |
| 2003/0001573 | A1 * | 1/2003 | Misic ............................ | 324/318 |
| 2005/0099179 | A1 * | 5/2005 | Monski et al. ................ | 324/318 |
| 2005/0107686 | A1 | 5/2005 | Chan et al. | |
| 2008/0007259 | A1 | 1/2008 | Driemel | |

FOREIGN PATENT DOCUMENTS

| DE | 10 2004 052 943 A1 | 6/2005 |
| DE | 10 2004 055 332 A1 | 6/2005 |
| DE | 10 2006 027 189 A1 | 12/2007 |

OTHER PUBLICATIONS

German Office Action dated Jan. 19, 2011 for corresponding German Patent Application No. DE 10 2010 028 163.8-54 with English translation.

* cited by examiner

*Primary Examiner* — Melissa Koval
*Assistant Examiner* — Rishi Patel
(74) *Attorney, Agent, or Firm* — Lempia Summerfield Katz LLC

(57) ABSTRACT

A combined head and nape magnetic-resonance coil device for a magnetic-resonance examination using a magnetic-resonance device, includes at least one posterior coil unit and at least two anterior coil units. At least one anterior coil unit of the at least two anterior coil units is mounted in relation to the posterior coil unit such that the at least one anterior coil unit may move along at least one direction of a spacing between the posterior coil unit and the at least one anterior coil unit.

17 Claims, 3 Drawing Sheets

MAGNETIC RESONANCE COIL DEVICE

This application claims the benefit of DE 10 2010 028 163.8, filed Apr. 23, 2010.

BACKGROUND

The present embodiments relate to a magnetic-resonance coil device.

Local coil devices are used in magnetic resonance imaging for recording images with a high signal-to-noise ratio. In order to improve the signal-to-noise ratio, use is made of high-field systems with base field strengths greater than or equal to 3 Tesla, for example. A patient is accommodated in a head and/or nape magnetic-resonance coil device for a head and/or nape examination. The head and/or nape magnetic-resonance coil device may be placed closely to the head and/or nape region of the patient in order to obtain a high signal-to-noise ratio and suppress noise signals.

As a result of large anatomical differences in the nape region of patients, head and/or nape magnetic-resonance coil devices may be used for a limited percentage of the population. In order to increase the field of application of the head and/or nape magnetic-resonance coil device and expand the field of application to include a higher percentage of the population, the head and/or nape magnetic-resonance coil device may be adapted to the region of the patients' nape.

Mechanically adaptable head and/or nape magnetic-resonance coil devices have been disclosed. An antenna or coil unit of the head and/or nape magnetic-resonance coil device is embedded in foam (e.g., in a mechanically flexible and deformable fashion). However, a disadvantage of the head and/or nape magnetic-resonance coil device is that many adjustable parts also include many work steps for adjusting the head and/or nape magnetic-resonance coil device to the patient in order to obtain a desired position of the head and/or nape magnetic-resonance coil device on the patient. This may result in undesired coupling between individual coil elements and/or coil antennas and hence, may result in a reduction in the signal-to-noise ratio. Additionally, there may be difficulties in reproducing a specific coil position as a result of an embodiment with very flexible foam parts.

SUMMARY AND DESCRIPTION

The present embodiments may obviate one or more of the drawbacks or limitations in the related art. For example, a magnetic-resonance coil device that provides an affective magnetic-resonance measurement with an optimum signal-to-noise ratio in a high percentage of the population may be provided.

In the present embodiments, a magnetic-resonance coil device (e.g., a combined head and nape magnetic-resonance coil device) for a magnetic-resonance examination using a magnetic-resonance device, includes at least one posterior coil unit and at least two anterior coil units.

At least one anterior coil unit of the at least two anterior coil units may be mounted in relation to the posterior coil unit such that the at least one anterior coil unit may move along at least one direction of a spacing between the posterior coil unit and the at least one anterior coil unit. A magnetic-resonance coil device may be a device that has at least one reception antenna. The at least one reception antenna may have individual reception coils and/or a reception coil array for receiving a signal. The magnetic-resonance coil device may include further electronics such as, for example, a preamplifier, a convertor, a digitizer, other elements, or combinations thereof. The magnetic-resonance coil device may be configured as a local coil device and adapted to the anatomy of a selected body part (e.g., the head and nape region) of the patient. The coil unit may have at least one reception antenna for receiving a magnetic-resonance signal. The magnetic-resonance coil device (e.g., the combined head and nape magnetic-resonance coil device) may advantageously be individually adapted to the anatomy of the head and nape region of the patient. The combined head and nape magnetic-resonance coil device may be flexibly used both for patients who need a lot of space in the nape region and for patients who need little space in the nape region by virtue of the fact that the combined head and nape magnetic-resonance coil device may rest directly against the respective nape region of the patient and thus achieve a high signal-to-noise ratio during a magnetic-resonance measurement. The magnetic-resonance coil device may be adapted to the patient by allowing the respective anterior coil unit to move along the direction until the respective anterior coil unit rests against the patient. Advantageously, positions of the anterior coil units may be reproduced during a further magnetic-resonance measurement.

A first anterior coil unit of the at least two anterior coil units is formed separately from a second anterior coil unit of the at least two anterior coil units. Formed separately from one another may include each one of the two anterior coil units forming a separate component, the functionality of which may be independent of a functionality and/or a position of the other of the two anterior coil units. The magnetic-resonance coil device may be adapted to the individual anatomy of different patients by.

At least one anterior coil unit of the at least two anterior coil units is formed by an anterior head coil unit, which is mounted in relation to the posterior coil unit such that the anterior head coil unit may move along the direction. The anatomy of the head region may be affectively adapted to independently of the anatomy of the nape region of the patient. By way of example, this is how the head region of the patient may be examined by magnetic resonance and how cramping of the patient in the nape region may advantageously be prevented within the process.

At least one anterior coil unit of the at least two anterior coil units is formed by an anterior nape coil unit that is mounted in relation to the posterior coil unit such that the anterior nape coil unit may move along the direction. The anatomy of the nape region may be affectively adapted to independently of the anatomy of the head region of the patient. By way of example, this is how the nape region of the patient may be examined by magnetic resonance and how cramping of the patient in the head region may advantageously be prevented within the process. By way of example, an examination with both the anterior coil units may be used for simultaneous measurements in both regions of the anatomy and/or for an angiography examination.

The magnetic-resonance coil device may include a guide and support unit that is configured to guide at least one anterior coil unit of the at least two anterior coil units with respect to a movement along the direction in relation to the posterior coil unit. The guide and support unit may be separate from the anterior coil units and may include, for example, a transmission element such as, for example, a toothed wheel. This allows a positioning of the anterior coil unit in relation to the posterior coil unit to be reproduced in a time-saving fashion that may easily be set.

In one embodiment, at least one anterior coil unit of the at least two anterior coil units has at least one first anterior coil element that is moveably mounted on the anterior coil unit.

The magnetic-resonance coil device may be efficiently adapted to the individual chest-nape transition anatomy of the patient, for example, such that the at least one first anterior coil element affectively rests against the patient. A magnetic-resonance measurement may thus be obtained with an advantageous signal-to-noise ratio.

If the at least one anterior coil unit has at least one second anterior coil element that, independently of the at least one first anterior coil element, is moveably mounted on the anterior coil unit, the head and nape magnetic-resonance coil device may, for example, be affectively adapted to different body regions in individual patients. At least one of the anterior coil elements (e.g., at least one of the at least one first anterior coil element and the at least one second anterior coil element) may be formed by a neck coil element or a chest coil element from the anterior nape coil unit. The anterior nape coil unit may have a plurality of anterior nape coil elements and/or a plurality of anterior chest coil elements such that the magnetic-resonance coil device may be adapted to different body parts in the chest-nape transition of the patient.

The individual anterior coil elements of the at least one anterior coil unit are arranged within the anterior coil unit such that the anterior coil elements are also moved when the anterior coil unit moves in relation to the posterior coil unit along the direction of the spacing to the posterior coil unit.

In one embodiment, the first anterior coil element and/or the second anterior coil element are at least partly curved. As a result of the at least partly curved first anterior coil element and/or second anterior coil element, a convex accommodation region (e.g., for accommodating the neck and/or nape region of the patient) may be obtained. A bend may be adapted to a basic shape of the neck and/or nape region such that the coil element may rest closely to the neck and/or nape region of the patient for a magnetic-resonance measurement.

In one embodiment, at least one anterior coil unit of the at least two anterior coil units has at least one jointed support unit for supporting at least one anterior coil element such that the at least one anterior coil element may move. A material-sparing movement of the at least one anterior coil element in relation to the other anterior coil unit may be provided. The at least one anterior coil element may be advantageously adapted to the anatomy (e.g., the transition between the chest region and the nape region) of the patient if the at least one jointed support unit includes, at least in part, a hinge unit.

In another embodiment, the jointed support unit has at least two joint axes that are aligned substantially perpendicularly with respect to one another. This makes an advantageous adaptation possible in different directions. Different anterior coil elements of the anterior coil unit may be adjusted independently of one another, to different anatomical requirements of the patient. In one embodiment, the first anterior coil element may rest against the neck region of the patient, and the second anterior coil element may, for example, rest against the chest region of the patient. The individual anterior coil elements may, for example, be configured in a wing-like fashion as a result of the rotatable mounting using the hinge unit. Alternatively, the anterior coil elements may be arranged with pretension on the anterior coil unit instead of being mounted using the jointed support unit (e.g., using the hinge unit).

In the present embodiment, a magnetic-resonance coil device (e.g., a combined head and nape magnetic-resonance coil device) for a magnetic-resonance examination using a magnetic-resonance device, includes at least one posterior coil unit, at least one anterior head coil unit, and at least one anterior nape coil unit.

The anterior nape coil unit includes at least one anterior coil element (e.g., a first anterior coil element) that is mounted on the anterior nape coil unit such that the at least one anterior coil element may move about an axis. The at least one anterior head coil unit and the at least one anterior nape coil unit may have a separate design from the at least one posterior coil unit. In one embodiment, the anterior nape coil unit has a separate design from the anterior head coil unit, such that the anterior nape coil unit and the anterior head coil unit may be used independently of one another. The magnetic-resonance coil device may be efficiently adapted to the individual anatomy of the chest-nape transition in the patient such that at least the anterior coil element affectively rests against the patient. Therefore, a magnetic-resonance measurement with an advantageous signal-to-noise ratio may be obtained. The head coil unit and/or the nape coil unit may be formed by a local coil unit for a magnetic-resonance measurement in the head region and/or in the nape region of the patient.

The anterior nape coil unit includes at least one further anterior coil element (e.g., a second anterior coil element) that, independently of the first anterior coil element, is moveably arranged, such that the magnetic-resonance coil device may be adapted to different subjective, anatomical conditions of different patients on an individual basis. At least one of the at least two anterior coil elements (e.g., the first anterior coil element and the second anterior coil element) may be formed by an anterior chest coil element, and at least one of the at least two anterior coil elements may be formed by an anterior neck coil element. The anterior nape coil unit may include a jointed support unit (e.g., a hinge unit) for moveably mounting at least one of the anterior coil elements.

In one embodiment, the anterior nape coil unit and/or the anterior head coil unit is/are moveably mounted in relation to the posterior coil unit such that the anterior nape coil unit and/or the anterior head coil unit move along at least one direction of a spacing between the respective anterior nape coil unit and/or the anterior head coil unit and the posterior coil unit. This situation may individually adapt the magnetic-resonance coil device (e.g., the combined head and nape magnetic-resonance coil device) to the anatomy of the patient. A flexible use of the combined head and nape magnetic-resonance coil device may be achieved both for patients who need a lot of space in the nape region and for patients who need little space in the nape region by virtue of the fact that the combined head and nape magnetic-resonance coil device may rest directly against the respective nape region of the patient. The magnetic-resonance coil device may be adapted to different patients by allowing the respective coil unit to move along the direction until the respective coil unit rests against the patient.

DETAILED DESCRIPTION OF THE DRAWINGS

Figure 1:
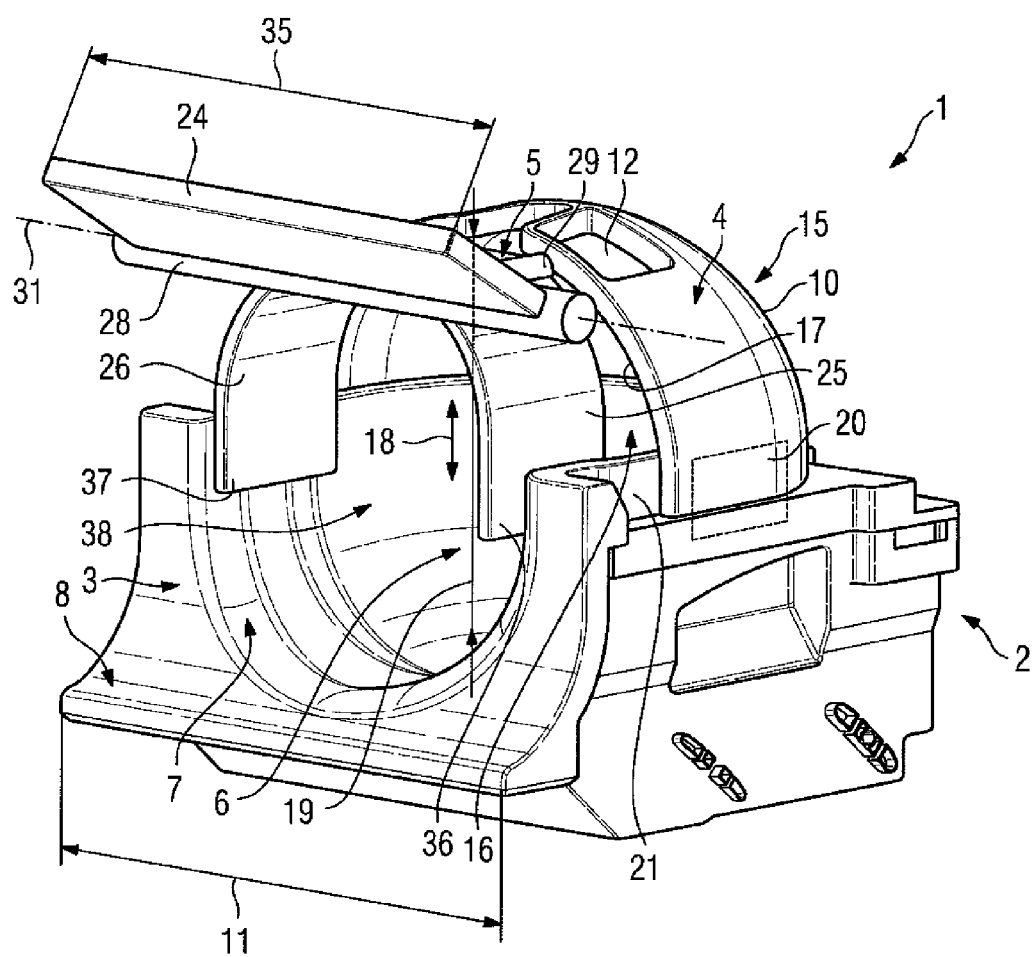
FIG. 1 shows one embodiment of a magnetic-resonance coil device.
Figure 2:
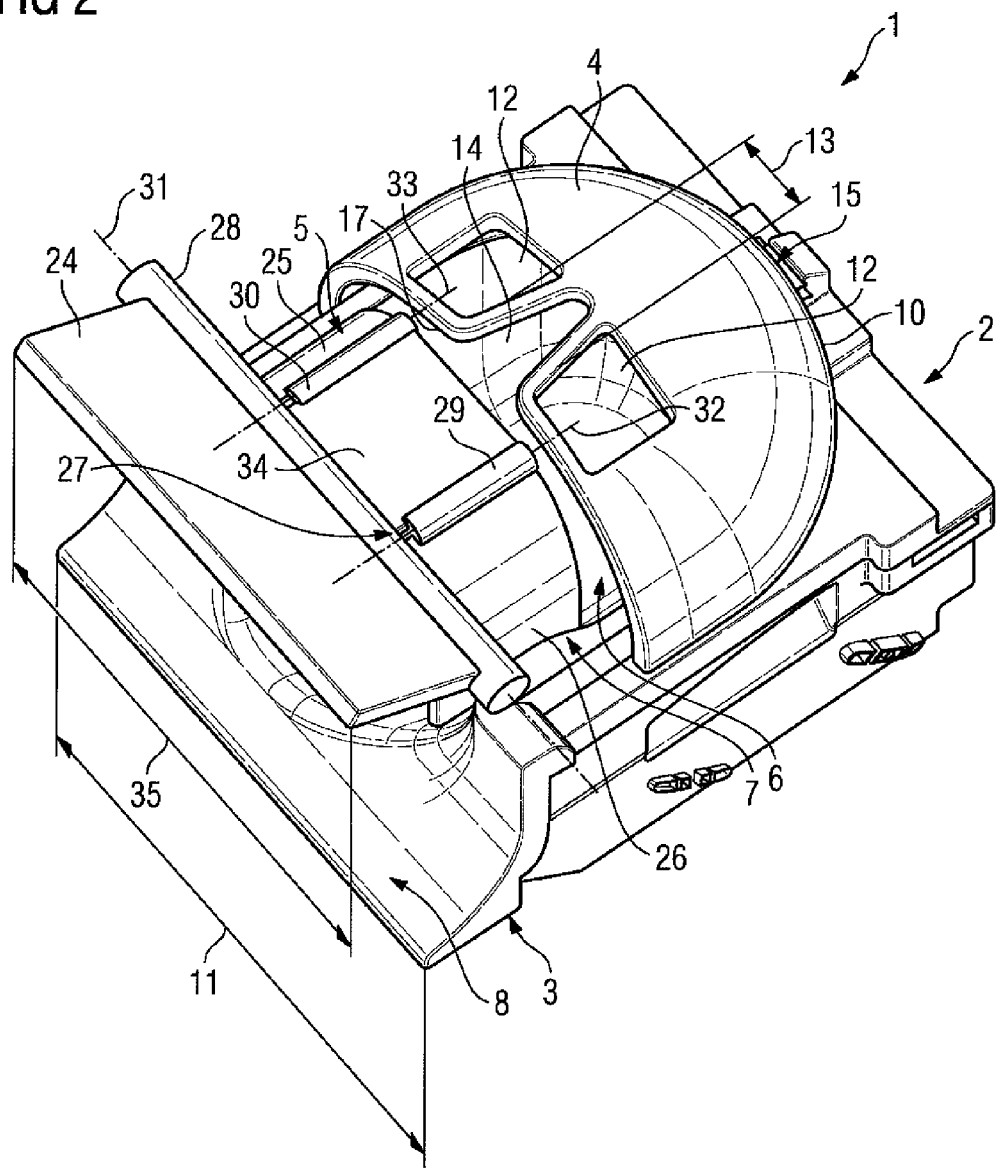
FIG. 2 shows a plan view of one embodiment of the magnetic-resonance coil device of FIG. 1.
Figure 3:
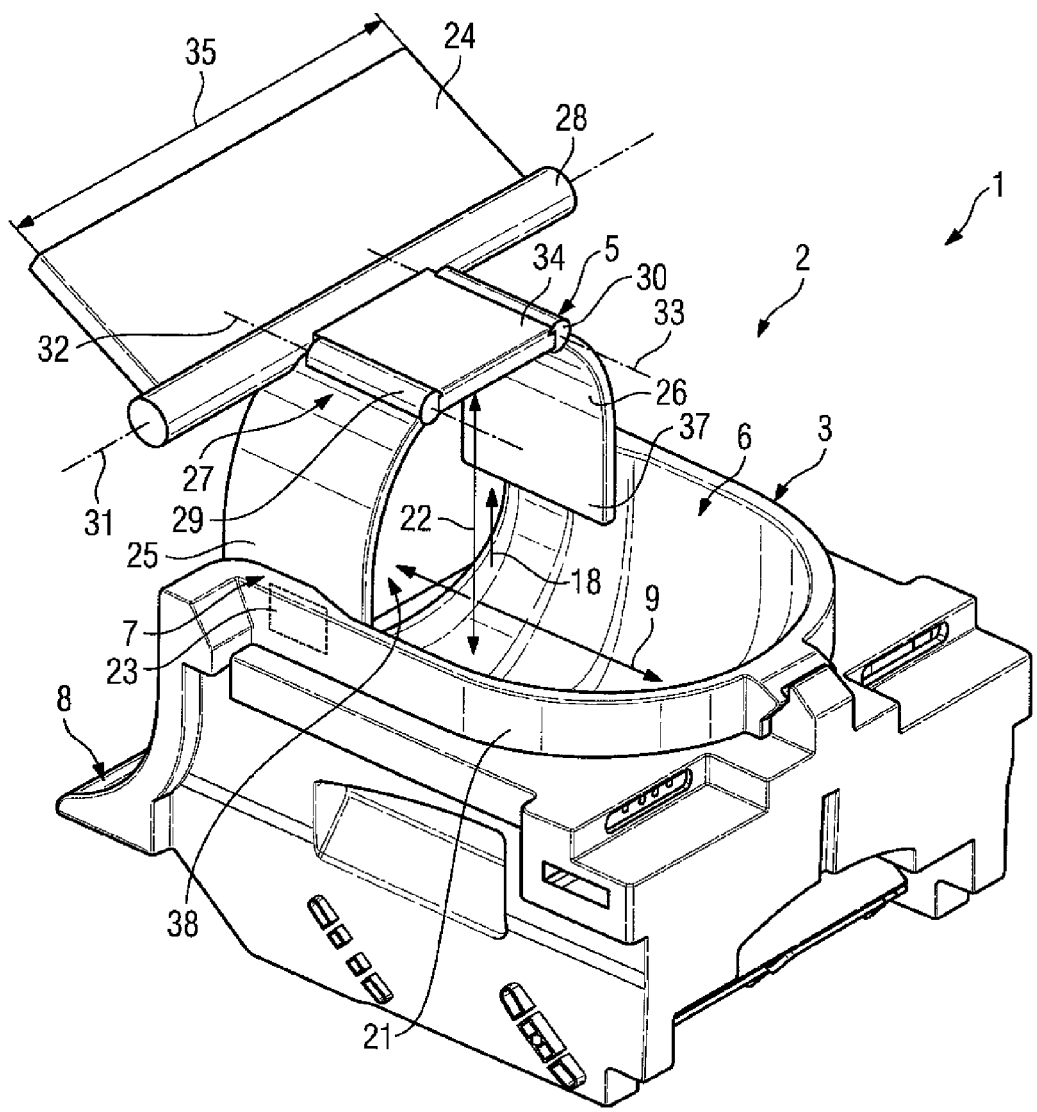
FIG. 3 shows one embodiment of a combination of a posterior coil unit and an anterior nape coil unit of the magnetic-resonance coil device.

A magnetic-resonance coil device 1 formed by a combined head and nape (e.g., neck) magnetic-resonance coil device 2 according to the present embodiments is illustrated in FIGS. 1-3. The combined head and nape magnetic-resonance coil device 2 is configured for a magnetic-resonance examination of the head and/or nape region of a patient using a magnetic-resonance device (not illustrated in any more detail).

The head and nape magnetic-resonance coil device 2 is arranged around the head and nape region of a patient for the magnetic-resonance examination. The head and nape magnetic-resonance coil device 2 includes a posterior coil unit 3 and two anterior coil units 4, 5 (e.g., individual coil units). The posterior coil unit 3 is arranged in a region of the back of the head of the patient for the magnetic-resonance examination, while the two anterior coil units 4, 5 are arranged on a side of the head region and/or neck region of the patient facing the face for the magnetic-resonance examination. The posterior coil unit 3 covers both the head region and the nape region of the patient. In one embodiment, the head and nape magnetic-resonance coil device 2 may also have two or more posterior coil units 3. By way of example, one posterior coil unit 3 may cover the head region and another posterior coil unit 3 may cover the nape region of the patient.

The individual coil units 3, 4, 5 of the head and nape magnetic-resonance coil device 2 are formed at least in part by reception antenna elements. The head and nape magnetic-resonance coil device 2 also includes evaluation electronics (not illustrated in any more detail) for the individual coil units 3, 4, 5, such as, for example, a preamplifier, a convertor and/or a digitizer.

The posterior coil unit 3 includes a head region 6, a nape region 7 and a shoulder region 8. The nape region 7 is arranged between the head region 6 and the shoulder region 8 along a direction 9 running from the head region 6 to the shoulder region 8. The head region 6 is provided for accommodating the head of the patient, and the nape region 7 is provided for accommodating the nape and/or neck of the patient. The head region 6 is open on a side facing the shoulder region 8 and is shaped like a skull cap for accommodating the skull of the patient on a side 10 facing away from the shoulder region 8. The head region 6 has a semicircular, concave cross section for forming a convex accommodation region. The cross section of the head region 6 is aligned substantially perpendicular to the direction 9. The head region 6 merges into the nape region 7. An accommodation region in the nape region 7 has a smaller cross section than the cross section of an accommodation region of the head region 6. The nape region 7 merges into the shoulder region 8, where the shoulder region 8 extends in the longitudinal direction 11 that is substantially perpendicular to the direction 9 running from the head region 6 to the shoulder region 8.

In one embodiment, the two anterior coil units 4, 5 have separate designs. A functionality and/or an arrangement of one of the two anterior coil units 4, 5 is independent of a functionality and/or an arrangement of the other of the two anterior coil units 4, 5. A first anterior coil unit of the two anterior coil units 4, 5 is formed by an anterior head coil unit 4, and a second anterior coil unit of the two anterior coil units 4, 5 is formed by an anterior nape coil unit 5.

The anterior head coil unit 4 has two openings 12 that are each provided for one eye region of the patient. A cutout 14 is arranged along a spacing 13 between the two openings 12, and the cutout 14 extends into the anterior head coil unit 4 from an edge region of the anterior head coil unit 4 (see FIG. 2). The anterior head coil unit 4 is positioned on the patient such that the nose of the patient is arranged in the cutout 14. The anterior head coil unit 4 is shaped like a skull cap in a region 15 facing away from the cutout 14 and thus forms an at least partly closed accommodation region 16 for the skull of the patient, together with a region of the posterior coil unit 3 shaped like a skull cap (e.g., see FIGS. 1 and 2). The anterior head coil unit 4 is open on a side 17 facing away from the region 15 shaped like a skull cap. The anterior head coil unit 4 arches over the accommodation region 16 in a semicircular fashion in an operational position.

The anterior head coil unit 4 is arranged and/or mounted in relation to the posterior coil unit 3 such that the anterior head coil unit 4 may move along a direction 18 of a spacing 19 between the anterior head coil unit 4 and the posterior coil unit 3. The head and nape magnetic-resonance coil device 2 has a guide and support unit 20 (see FIG. 1) that allows a relative movement of the anterior head coil unit 4 along the direction 18 in relation to the posterior coil unit 3. The guide and support unit 20 is configured such that an operator may set a precise spacing 19 between the anterior head coil unit 4 and the posterior coil unit 3. This may be advantageous in the case of two different magnetic-resonance examinations that are spaced apart by a long time interval, because this allows the same spacing 19 to be set again and thus allows the reproduction of measurement conditions for the magnetic-resonance examinations carried out at different times. The guide and support unit 20 may allow the spacing 19 between the anterior head coil unit 4 and the posterior coil unit 3 to be varied by a few centimeters. A maximum variation of the spacing 19 may be at least 5 cm. In one embodiment, the maximum variation of the spacing 19 is at least 8 cm.

By way of example, the guide and support unit 20 may include at least one transmission element such as, for example, a toothed wheel, a toothed rack, a screw mechanism, and/or further transmission elements to bring about a movement of the anterior head coil unit 4 in relation to the posterior coil units 3 with low losses. The guide and support unit 20 may also be used to separate the anterior head coil unit 4 from the posterior coil unit 3 such that a magnetic-resonance examination may be carried out using only the posterior coil unit 3 or using the posterior coil unit 3 and the anterior nape coil unit 5. Undesired cramping of the head region of the patient may be advantageously avoided in a magnetic-resonance measurement in the neck and nape region of the patient.

The posterior coil unit 3 has a wall 21 facing the accommodation region 16. The wall 21 is covered by the anterior head coil unit 4 in an operational position of the anterior head coil unit 4 and of the posterior coil unit 3. The guide and support unit 20 is arranged in this overlap, region and/or covering region between the wall 21 of the posterior coil unit 3 and the anterior head coil unit 4.

The anterior nape coil unit 5 may be arranged and/or mounted in relation to the posterior coil unit 3 such that the anterior nape coil unit 5 may move along the direction 18 of a spacing 22 between the anterior nape coil unit 5 and the posterior coil unit 3. The head and nape magnetic-resonance coil device 2 includes a further guide and support unit 23 that allows a relative movement of the anterior nape coil unit 5 along the direction 18 in relation to the posterior coil unit 3 (see FIG. 3). The further guide and support unit 23 is configured such that an operator may set a precise spacing 22 between the anterior nape coil unit 5 and the posterior coil unit 3. This may be advantageous, for example, in the case of two different magnetic-resonance examinations that are spaced apart by a long time interval, because this allows the same spacing to be precisely set again and thus allows the reproduction of measurement conditions for the magnetic-resonance examinations carried out at different times. The spacing 22 between the anterior nape coil unit 5 and the posterior coil unit 3 may be varied by a few centimeters with the further guide and support unit 23. A maximum variation of the spacing 22 may be at least 5 cm. In one embodiment, the maximum variation of the spacing 22 is at least 8 cm.

By way of example, the further guide and support unit 23 may include at least one transmission element such as, for example, a toothed wheel, a toothed rack, a screw mechanism, and/or further transmission elements to bring about a movement of the anterior nape coil unit 5 in relation to the posterior coil units 3 with low losses. The further guide and support unit 20 may be used to separate the anterior nape coil unit 5 from the posterior coil unit 3 such that a magnetic-resonance examination may be carried out using only the posterior coil unit 3 or using the posterior coil unit 3 and the anterior head coil unit 4. Undesired cramping of the nape region and/or the chest-nape transition of a patient may be advantageously avoided in such a magnetic-resonance measurement in the head region of the patient. A magnetic-resonance measurement using the anterior head coil unit 4 and the anterior nape coil unit 5, together with the posterior coil unit 3, may be performed at all times as may be useful for illuminating both regions of the anatomy, for example, for an angiography examination.

The anterior nape coil unit 5 includes three coil elements 24, 25, 26 that are moveably mounted on the anterior nape coil unit 5. A first coil element 24 is formed by a chest coil element 24. A second coil element 25 and a third coil element 26 are formed by a neck coil element 25, 26, respectively. The nape coil unit 5 has a jointed support unit 27 for supporting the three coil elements 24, 25, 26 such that the three coil elements 24, 25, 26 may move. The jointed support unit 27 includes three hinge units 28, 29, 30 that are each provided for supporting one of the three anterior coil elements 24, 25, 26 such that the one anterior coil element 24, 25 or 26 may move. Each of the three hinge units 28, 29, 30 includes a rotational axis 31, 32, 33, about which the respective anterior coil element 24, 25, 26 is mounted such that the anterior coil elements 24, 25, 26 may rotate. The nape coil unit 5 includes a plate-shaped central region 34, on which the three coil elements 24, 25, 26 are mounted such that the three coil elements 24, 25, 26 may rotate using the hinge units 28, 29, 30. The two rotational axes 32, 33 for the two neck coil elements 25, 26 are substantially parallel to one another and are arranged perpendicularly to the rotational axis 31 of the chest coil element 24. The three rotational axes 31, 32, 33 are substantially perpendicular to the direction 18 of the spacing 22 between the posterior coil unit 3 and the anterior nape coil unit 5.

The anterior chest coil element 24 is arranged on a side of the anterior nape coil unit 5 that faces away from the anterior head coil unit 4. The anterior chest coil element 24 may have a substantially rectangular design. The anterior chest coil element 24 is arranged within the anterior nape coil unit 5 such that a longitudinal extent 35 of the anterior chest coil element 24 is designed to be substantially parallel to the longitudinal extent 11 of the shoulder region 8 of the posterior coil unit 3 in an operational position of the anterior nape coil unit 5 with the posterior coil unit 3. In one embodiment, the rotational axis 31 of the hinge unit 28 for supporting the anterior chest coil element 24 such that the anterior chest coil element 24 may rotate runs substantially parallel to the longitudinal extent 35 of the anterior chest coil element 24. The hinge unit 28 for supporting the anterior chest coil element 24 such that the anterior chest coil element 24 may rotate is arranged on a side of the anterior chest coil element 24 facing the plate-shaped central region 34.

In one embodiment, the two anterior neck coil elements 25, 26 have a wing-like design. The two anterior neck coil elements 25, 26 are arranged at opposite end regions on the plate-shaped central region 34. The two anterior neck coil elements 25, 26 extend away from the plate-shaped central region 34 of the anterior nape coil unit 5 in opposite directions aligned substantially parallel to the rotational axis 31 for supporting the anterior chest coil element 24 such that the anterior chest coil element 24 may rotate. Each of the two anterior neck coil elements 25, 26 has a substantially rectangular, curved shape. A curve in the individual anterior neck coil elements 25, 26 is configured such that an accommodation region 38, which is at least partly surrounded by the anterior neck coil element 25, 26, is formed in a convex fashion. In an operational position of the anterior nape coil unit 5 and the posterior coil unit 3, the two anterior neck coil elements 25, 26 project into the accommodation region 38, which is spanned by the posterior coil unit 3, with end regions 36, 37 facing away from the plate-shaped central region 34 of the anterior nape coil unit 5. In the operational position, the anterior neck coil elements 25, 26 of the anterior nape coil unit 5 cover the nape region 7 of the posterior coil unit 3.

If both the anterior nape coil unit 5 and the anterior head coil unit 4 are arranged on the posterior coil unit 3 in an operational position, the two anterior neck coil elements 25, 26 are arranged on a region of the anterior nape coil unit 5 that faces the anterior head coil unit 4, on the plate-shaped central region 34. The anterior chest coil element 24 is arranged on a region of the anterior nape coil unit 5 that faces away from the anterior head coil unit 4, on the plate-shaped central region 34.

The movement of the anterior head coil unit 4 along the direction 18 of the spacing 19, 22, which is independent of a movement of the anterior nape coil unit 5, allows an optimum and effective adaptation of the combined head and nape magnetic-resonance coil device 2 to the anatomy of the head region independently of the anatomy of the neck and nape region of the patient. In the process, the anterior head coil unit 4 and the anterior nape coil unit 5 may be moved (e.g., slid) along the direction 18 of the spacing 19, 22 until the two anterior coil units 4, 5 rest against the head, the neck, and/or the nape of the patient. The anterior coil elements 24, 25, 26 are moved together with the movement of the anterior nape coil unit 3 along the direction 18. The moveable, anterior neck coil elements 25, 26 and the moveable, anterior chest coil element 24 are subsequently adapted to the individual, patient-dependent anatomy of the chest region and to the individual, patient-dependent anatomy of the neck region of the patient by positioning the individual coil elements 24, 25, 26 such that the individual coil elements 24, 25, 26 rest against the corresponding body region of the patient by a rotation about the respective rotational axis 31, 32, 33. In the process, as a result of the additional mobility of the individual coil elements 24, 25, 26, the anterior nape coil unit 5 may be individually adapted in the case of patients who need a lot of space in the neck, the nape and/or the chest region and in the case of patients who need little space in the neck, the nape, and/or the chest region.

An affective signal-to-noise ratio is achieved as a result of the adjustable mechanism for adaptation of the head and nape magnetic-resonance coil device to the head region and/or nape region of the patient. The head and nape magnetic-resonance coil device 2 may be used for a larger percentage of the population by providing a large, maximum accommodation region for the head and/or nape region of the patient and adapting the head and nape magnetic-resonance coil device 2 to the respective patient-related anatomy of the different patients utilizing the mobility of the individual coil units 4, 5 and the coil elements 24, 25, 26.

In the process, the individual anterior coil elements 24, 25, 26 and/or the individual anterior coil units 4, 5 may be arranged around the patient such that the individual anterior coil elements 24, 25, 26 and/or the anterior coil units 4, 5 overlap in part. The individual coil elements 24, 25, 26 and/or the individual anterior coil units 4, 5 may overlap in part with the posterior coil unit 3. The individual anterior coil elements 24, 25, 26 and/or the individual coil units 4, 5 may be partly arranged with a space therebetween and/or with a space with respect to the posterior coil unit 3. If the individual anterior coil elements 24, 25, 26 and/or the individual coil units 3, 4, 5 are partly arranged with a space therebetween, the individual anterior coil elements 24, 25, 26 and/or the individual coil units 3, 4, 5 are connected for a magnetic-resonance measurement (e.g., with capacitive decoupling). If the individual anterior coil elements 24, 25, 26 and/or the individual coil units 3, 4, 5 are arranged in an overlapping fashion, the individual anterior coil elements 24, 25, 26 and/or the individual coil units 3, 4, 5 are connected for a magnetic-resonance measurement (e.g., with inductive decoupling).

In one embodiment, a combination of a capacitively decoupled circuit and an inductively decoupled circuit for a magnetic-resonance measurement may be applied for the individual anterior coil elements 24, 25, 26 and/or the individual coil units 3, 4, 5.

In another embodiment, the hinge units 28, 29, 30 with the rotational axes 31, 32, 33, which are provided for supporting the two anterior neck coil elements 25, 26 and the anterior chest coil element 24 such that the two anterior neck coil elements 25, 26 and the anterior chest coil element 24 may rotate, may be replaced by any number of jointed support units and/or jointed elements for moveably supporting the individual anterior coil elements 24, 25, 26.

In one embodiment, the two hinge units 29, 30 with the substantially parallel rotational axes 32, 33 for the two anterior neck coil elements 25, 26 may be arranged directly next to one another or to form a single hinge unit for supporting the two anterior neck coil elements 25, 26 such that the two anterior neck coil elements 25, 26 may rotate. In this embodiment, the plate-shaped central region 34 of the anterior nape coil unit 5 may not be provided. The hinge unit 28, which is provided for supporting the anterior chest coil element 24 such that the anterior chest coil element 24 may rotate, may be formed, at least in part, integrally with the hinge unit or the hinge units 29, 30 for supporting the two anterior neck coil elements 25, 26 such that the two anterior neck coil elements 25, 26 rotate. By way of example, the hinge unit 28, which is provided for supporting the anterior chest coil element 24 such that the anterior chest coil element 24 may rotate, may have a length along the rotational axis 31 that substantially corresponds to a transverse extent of the hinge unit or the hinge units 29, 30 for supporting the two anterior neck coil elements 25, 26 such that the two anterior neck coil elements 25, 26 may rotate.

In another embodiment, a jointed support unit 27 may not be used for the moveable support of at least one of the three anterior coil elements 24, 25, 26 of the anterior nape coil unit 5. The individual anterior coil elements 24, 25, 26 may, for example, be configured as a mechanically flexible printed circuit board that may alternatively or in addition thereto be embedded in a flexible material. The individual anterior coil elements 24, 25, 26 may be moved and/or adapted such that the anterior coil elements 24, 25, 26 are pushed against the corresponding body region of the patient by an operator.

At least one of the anterior coil elements 24, 25, 26 of the anterior nape coil unit 5 may have an initial position, in which the at least one of the anterior coil element 24, 25, 26 is arranged in a pre-tensioned and/or pre-bent fashion. In order to position the individual anterior coil elements 24, 25, 26 on the patient, the individual anterior coil elements 24, 25, 26 are pressed outward by the corresponding body part of the patient. Therefore, the individual anterior coil elements 24, 25, 26 rest against the body part of the patient for the purpose of a magnetic-resonance measurement.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A combined head and neck magnetic-resonance coil device for a magnetic resonance examination using a magnetic-resonance device, the combined head and neck magnetic-resonance coil device comprising:
   a posterior coil unit; and
   at least two anterior coil units, wherein one of the at least two anterior coil units is an anterior nape coil unit, the anterior nape coil unit being mounted in relation to the posterior coil unit such that the anterior nape coil unit is movable along at least one direction of a spacing between the posterior coil unit and the anterior nape coil unit,
   wherein the anterior nape coil unit comprises a first anterior coil element that is moveably mounted on the anterior nape coil unit, and a second anterior coil element that is moveably mounted on the anterior nape coil unit, a movement of the second anterior coil element being independent of a movement of the first anterior coil element.

2. The magnetic-resonance coil device as claimed in claim 1, wherein a first anterior coil unit of the at least two anterior coil units is formed separately from a second anterior coil unit of the at least two anterior coil units.

3. The magnetic-resonance coil device as claimed in claim 1, wherein an anterior coil unit of the at least two anterior coil units forms an anterior head coil unit, the anterior head coil unit being mounted in relation to the posterior coil unit such that the anterior head coil unit is movable along the at least one direction.

4. The magnetic-resonance coil device as claimed in claim 1, further comprising a guide and support unit configured to guide the one anterior coil unit with respect to a movement along the at least one direction in relation to the posterior coil unit.

5. The magnetic-resonance coil device as claimed in claim 1, wherein the first anterior coil element or the second anterior coil element is formed by a chest coil element from the anterior nape coil unit.

6. The magnetic-resonance coil device as claimed in claim 1, wherein the first anterior coil element or the second anterior coil element is formed by a neck coil element from the anterior nape coil unit.

7. The magnetic-resonance coil device as claimed in claim 1, wherein the first anterior coil element, the second anterior coil element, or the first anterior coil element and the second anterior coil element are at least partly curved.

8. The magnetic-resonance coil device as claimed in claim 1, wherein the anterior nape coil unit comprises a jointed support unit configured for supporting the first anterior coil element such that the first anterior coil element is movable.

9. The magnetic-resonance coil device as claimed in claim 8, wherein the jointed support unit comprises a hinge unit.

10. The magnetic-resonance coil device as claimed in claim 8, wherein the jointed support unit has at least two joint axes that are aligned substantially perpendicularly with respect to one another.

11. A magnetic-resonance coil device for a magnetic-resonance examination using a magnetic-resonance device, the magnetic-resonance coil device comprising:
  a posterior coil unit;
  an anterior head coil unit; and
  an anterior nape coil unit, wherein the anterior nape coil unit comprises:
    a first anterior coil element that is mounted on the anterior nape coil unit such that the first anterior coil element is movable about an axis; and
    a second anterior coil element that is moveably mounted on the anterior nape coil unit, a movement of the second anterior coil element being independent of the movement of the first anterior coil element.

12. The magnetic-resonance coil device as claimed in claim 11, wherein the second anterior coil element is moveably mounted about another axis independently of the first anterior coil element.

13. The magnetic-resonance coil device as claimed in claim 11, wherein the anterior nape coil unit is moveably mounted in relation to the posterior coil unit such that the anterior nape coil unit is movable along at least one direction of a spacing between the anterior nape coil unit and the posterior coil unit.

14. The magnetic-resonance coil device as claimed in claim 11, wherein the anterior head coil unit is moveably mounted in relation to the posterior coil unit such that the anterior head coil unit is movable along at least one direction of a spacing between the anterior head coil unit and the posterior coil unit.

15. The magnetic-resonance coil device as claimed in claim 12, wherein the anterior nape coil unit is moveably mounted in relation to the posterior coil unit such that the anterior nape coil unit is movable along at least one direction of a spacing between the anterior nape coil unit and the posterior coil unit.

16. The magnetic-resonance coil device as claimed in claim 12, wherein the anterior head coil unit is moveably mounted in relation to the posterior coil unit such that the anterior head coil unit is movable along at least one direction of a spacing between the anterior head coil unit and the posterior coil unit.

17. The magnetic-resonance coil device as claimed in claim 13, wherein the anterior head coil unit is moveably mounted in relation to the posterior coil unit such that the anterior head coil unit is movable along the at least one direction of a spacing between the anterior head coil unit and the posterior coil unit.

* * * * *